(12) United States Patent
Nagata

(10) Patent No.: US 7,604,904 B2
(45) Date of Patent: Oct. 20, 2009

(54) PELLICLE FOR LITHOGRAPHY

(75) Inventor: Yoshihiko Nagata, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 854 days.

(21) Appl. No.: 10/925,040

(22) Filed: Aug. 25, 2004

(65) Prior Publication Data
US 2005/0048380 A1 Mar. 3, 2005

(30) Foreign Application Priority Data
Aug. 27, 2003 (JP) ............... 2003-208948

(51) Int. Cl.
G03F 9/00 (2006.01)
(52) U.S. Cl. ....................................... 430/5
(58) Field of Classification Search ............... 430/5
See application file for complete search history.

(56) References Cited
U.S. PATENT DOCUMENTS
4,657,805 A * 4/1987 Fukumitsu et al. ........ 428/215
4,861,402 A   8/1989 Gordon
5,339,197 A * 8/1994 Yen ........................ 359/359
6,335,231 B1 * 1/2002 Yamazaki et al. ......... 438/151
6,350,549 B1 * 2/2002 Sakurai et al. ............ 156/101
2005/0025959 A1 * 2/2005 Bellman .................. 428/336

FOREIGN PATENT DOCUMENTS
JP 58-219023 12/1983
JP 60-083032 5/1985
JP 2000-026125 1/2000
JP 2000-264671 9/2000
JP 2000-292908 10/2000
JP A-2000-305255 11/2000
JP A-2001-255644 9/2001

* cited by examiner

Primary Examiner—Mark F Huff
Assistant Examiner—Jonathan Jelsma
(74) Attorney, Agent, or Firm—Oliff & Berridge, PLC

(57) ABSTRACT

There is disclosed a pellicle for lithography comprising a pellicle film, a pellicle frame to which the pellicle film is adhered, and a sticking layer placed on another end face of the pellicle frame, wherein the pellicle film consists of multi-layer structure of fluorine-doped silica and fluorocarbon resin. Thereby, there is provided a pellicle for lithography which has high transmittance and high light stability against light of short wavelength such as far-ultraviolet light in a range of 200-300 nm and especially vacuum ultraviolet light of 200 nm or less, and is sufficiently practicable.

12 Claims, 3 Drawing Sheets (a)

(b)

PELLICLE FOR LITHOGRAPHY

BACKGROUND OF THE INVENTION

1. Field of the Invention

The present invention relates to a pellicle for lithography, in particular, a pellicle for lithography used as a dust guard of a mask for lithography when producing a semiconductor device such as LSI and VLSI or a liquid crystal display panel.

2. Description of the Related Art

In the production of a semiconductor device such as LSI and VLSI or a liquid crystal display panel, a pattern is formed by exposing a semiconductor wafer or an original plate for liquid crystal display panel. In this case, if dust particles adhere to an original plate for exposure (a mask for lithography) to be used, the dust particles absorb or bend light. Thus, a transferred pattern may be deformed, or an edge may be rough, and also the ground may be soiled to be black, resulting in degradation of dimensions, quality and an appearance or the like, which may lead to a problem of lowering performance or a production yield of a semiconductor device, a liquid crystal display panel, or the like.

For this reason, these processes are usually performed in a clean room. However, since it is difficult to always keep an original plate for exposure clean even in the clean room, there is adopted a method of attaching a pellicle as a dust guard which well transmits light for exposure to a surface of the original plate for exposure. In this case, dust particles do not adhere directly to the surface of the original plate for exposure, but adhere to a pellicle film. Accordingly, if a focus is set on the pattern of the original plate for exposure at the time of lithography, dust particles on the pellicle film do not affect the transfer.

An example of such a pellicle is shown in FIG. 2. In a pellicle 1, a pellicle film 3 is adhered to an upper end face of a pellicle frame 2 via generally an adhesive layer. Further a vent 7 can be provided at least on one side of the pellicle frame, and a dustproof filter 8 can be provided on the vent 7.

Such a pellicle is manufactured by adhering a transparent pellicle film made of nitrocellulose, cellulose acetate, or the like which well transmits light used for exposure, to a pellicle frame made of aluminum alloy such as A7075 subjected to black alumite treatment, stainless steel, polyethylene or the like, via a good solvent for the pellicle film applied to the upper side of the frame and air-dried (for example, see Japanese Patent Laid-open (Kokai) No. 58-219023), or via an adhesive such as acrylic resin and epoxy resin (for example, see U.S. Pat. No. 4,861,402 specification or Japanese Patent Publication (Kokoku) No. 63-27707). Furthermore, in order to attach an original plate for exposure, a sticking layer made of polybutene resin, polyvinyl acetate resin, acrylic resin, or the like, and a sticking layer protection liner for protecting the sticking layer can be provided on the lower part of pellicle frame.

In recent years, as a semiconductor device has been further miniaturized, a pattern rule in LSI or the like has become finer up to sub-quarter micron. Along with that, wavelength of a light source for exposure has become shorter. Namely, it has become shorter from g-line (436 nm) and i-line (365 nm) which had been mainly used, to a KrF excimer laser (248 nm) and an ArF excimer laser (193 nm). And recently, an $F_2$ laser (157 nm) which generates light of further shorter wavelength is to be put into practice as a light source for exposure. In particular, in the case of using the $F_2$ laser as a light source for exposure, there has been a problem in practicability of the pellicle in which an amorphous fluoropolymer is used as a pellicle film. This is because, even if an amorphous fluoropolymer which has been used for conventional lithography with the KrF or ArF excimer laser is utilized, it has low transmittance in the $F_2$ laser beam.

Then, silica (silica glass) has come into notice as a material for a pellicle film with high transmittance and high light stability against an $F_2$ laser beam. However, even silica absorbs light of 157 nm to some degree, and practical transmittance for a pellicle can not be obtained. In recent years, it was found that fluorine-doped silica has high transmittance against light of 157 nm in wavelength. Therefore it has been proposed that it should be used as a material of a pellicle film for a pellicle used for an $F_2$ laser (for example, see Japanese Patent Laid-open (Kokai) No. 2000-292908).

Fluorine-doped silica has high transmittance and high light stability against light of 157 nm. However, in order to prevent flexure due to its own weight when it is adhered to a pellicle frame as a pellicle film, it needs more than 800 μm in thickness. In the case of thickening the pellicle film as described above, from an optical point of view, it is impossible to ignore the pellicle film in a lithography process. Thus, this must be taken into consideration when designing an aligner. Therefore, extremely high flatness, low flexure and low gradient are required, and it is very difficult to attach the pellicle to a reticle (an original plate for exposure).

In the case of utilizing a pellicle frame made of aluminum alloy as general when fluorine-doped silica is used as a material for a pellicle film, it is difficult to obtain mechanical flatness, and there is also difficulty in attachment. Moreover, it is difficult to use the pellicle frame made of aluminum alloy in practice since it deforms the fluorine-doped pellicle film depending on change of temperature.

As a result, it is not avoidable to use as a pellicle frame a silica glass, of which thermal expansion coefficient is the same as that of fluorine-doped silica. However, if the silica glass is actually used as a pellicle frame, it should be too expensive, and thus, the problem in cost occurs.

On the other hand, if the pellicle film made of fluorine-doped silica that is processed to be extremely thin, for example, to be several tens of micrometer in thickness, is used for a pellicle, the optical problem is overcome. That is, it does not need to take this into consideration when designing an aligner. However, it is difficult to produce such a thin pellicle film made of fluorine-doped silica through, for example, polishing. Even if it can be processed through polishing or the like, it is easy to break. Therefore, it possibly causes damage to an exposure system since it breaks soon. Consequently, it has not been of practical use.

SUMMARY OF THE INVENTION

The present invention has been accomplished in view of the aforementioned problems, and its object is to provide a pellicle for lithography which has high transmittance and high light stability against light of short wavelength such as far-ultraviolet light in a range of 200-300 nm and especially, vacuum ultraviolet light of 200 nm or less, and is sufficiently practicable.

The present invention has been made in order to solve such problems. The present invention provides a pellicle for lithography comprising a pellicle film, a pellicle frame to which the pellicle film is adhered, and a sticking layer placed on another end face of the pellicle frame, wherein the pellicle film consists of multi-layer structure of fluorine-doped silica and fluorocarbon resin.

As described above, when the pellicle film consists of multi-layer structure of fluorine-doped silica and fluorocarbon resin, a pellicle having high transmittance and high light stability against light of short wavelength such as far-ultraviolet light in the range of 200-300 nm and especially, vacuum ultraviolet light of 200 nm or less can be obtained easily and at the low cost. Moreover, the multi-layer structure enables a pellicle film to compensate for disadvantages in the case of using either of them separately as the pellicle film. Namely, in the case of using only fluorine-doped silica for the pellicle film, it needs a thickness of 800 μm or more in order to keep sufficient strength. However, the multi-layer structure enables it to be thin. Although there was an optical problem when its thickness was 800 μm or more, and there was a need to take this into consideration when designing an aligner, the present invention overcomes such problems since the pellicle film can be made thin. Further, because fluorocarbon resin can also be made thin, it is possible to utilize the pellicle film for a practical period if changing in color occurs.

In this case, a thickness of a layer of the fluorine-doped silica can be 20 μm or less, and a thickness of a layer of the fluorocarbon resin can be 1 μm or less.

Even if a thickness of a layer of the fluorine-doped silica is 20 μm or less and a thickness of a layer of the fluorocarbon resin is 1 μm or less as described above, the pellicle film can keep sufficient strength due to the multi-layer structure. If a thickness of the layer of the fluorine-doped silica is 20 μm or less, from an optical point of view, it is possible to ignore the pellicle film. Therefore, there is no need to take this into consideration when designing an aligner, and design of the aligner becomes easier. If a thickness of the layer of the fluorocarbon resin is 1 μm or less, it is possible to utilize the pellicle film for a long time enough for practical use even when changing in color occurs owing to absorption of light of short wavelength by the fluorocarbon resin layer.

In this case, the fluorocarbon resin is preferably an amorphous fluoropolymer.

If the fluorocarbon resin is an amorphous fluoropolymer as described above, a pellicle with high transmittance and high light stability which can endure use of light of short wavelength such as far-ultraviolet light in a range of 200-300 nm and especially, vacuum ultraviolet light of 200 nm or less can be surely obtained.

In this case, OH group content of the fluorine-doped silica is preferably 10 ppm or less.

As described above, when OH group content of the fluorine-doped silica is 10 ppm or less, it sufficiently meets the use of light of short wavelength and in addition, high transmittance can be maintained since it is difficult to be degraded. Therefore, the pellicle having further long lifetime and high performance can be obtained.

In this case, absorption coefficient of ultraviolet ray at wavelength of 157 nm of the layer of the fluorocarbon resin of the pellicle film is preferably 0.06/μm or less.

As described above, if absorption coefficient of ultraviolet ray at wavelength of 157 nm of the layer of the fluorocarbon resin of the pellicle film is 0.06/μm or less, a pellicle with sufficiently high transmittance and high light stability against light of short wavelength can be obtained.

In this case, it is preferable that the pellicle frame is made of silicon single crystal.

If the pellicle frame is made of silicon single crystal as described above, the pellicle frame can have high purity and high strength. Further, dust particles generated from the pellicle frame can be lowered, and bonding with the fluorine-doped silica becomes easy.

In this case, the pellicle film and the pellicle frame are preferably bonded together via a silicon thin film.

The pellicle film and the pellicle frame made of silicon single crystal are directly bonded together via a silicon thin film as described above. Thereby, an adhesive is not required for the bonding. Consequently, there is little possibility of degradation of bonding part due to light of short wavelength and generation of dust particles, and accuracy in dimension at the bonding part increases.

In this case, it is preferable that in-plane orientation of the silicon single crystal constituting the pellicle frame is (100).

As described above, if in-plane orientation of the silicon single crystal constituting the pellicle frame is (100), it is desirable for a material of the pellicle frame used in the present invention since it excels in workability when manufacturing the pellicle. Silicon single crystal with in-plane orientation (100) is easily available and has an advantage in terms of price since it is generally used.

As explained above, according to the present invention, since a pellicle film consisting of multi-layer structure of fluorine-doped silica and fluorocarbon resin is used, a pellicle for lithography with high transmittance and light stability against light of short wavelength such as far-ultraviolet light in the range of 200-300 nm and especially, vacuum ultraviolet light of 200 nm or less, and with high practicability can be provided easily and at the low cost.

DETAILED DESCRIPTION OF THE PREFERRED EMBODIMENTS

Embodiments of the present invention will be explained hereinafter. However, the present invention is not limited thereto.

As a result of further study, the inventor of the present invention found that a layer of fluorine-doped silica and a layer of fluorocarbon resin can be made thin respectively when multi-layer structure of fluorine-doped silica and fluorocarbon resin is used for a pellicle film, and thereby, the pellicle film in which respective disadvantages are covered and respective advantages are combined can be obtained. Thereby, the present invention has been completed.

Figure 1:
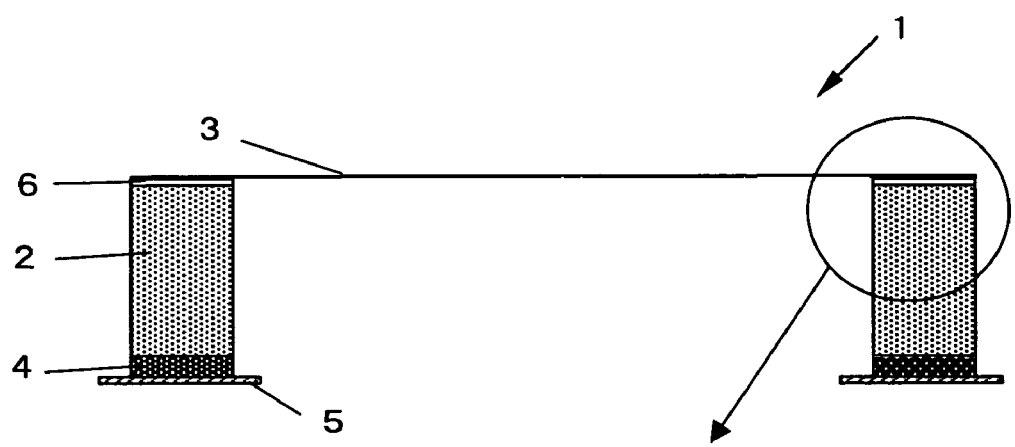
FIG. 1 is a schematic view showing an example of the pellicle of the present invention. (a) a sectional view of the pellicle, (b) an enlarged sectional view of a pellicle film.
Figure 1:
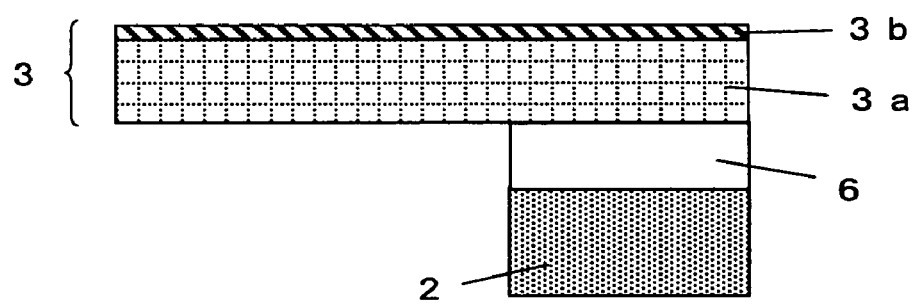
Figure 2:
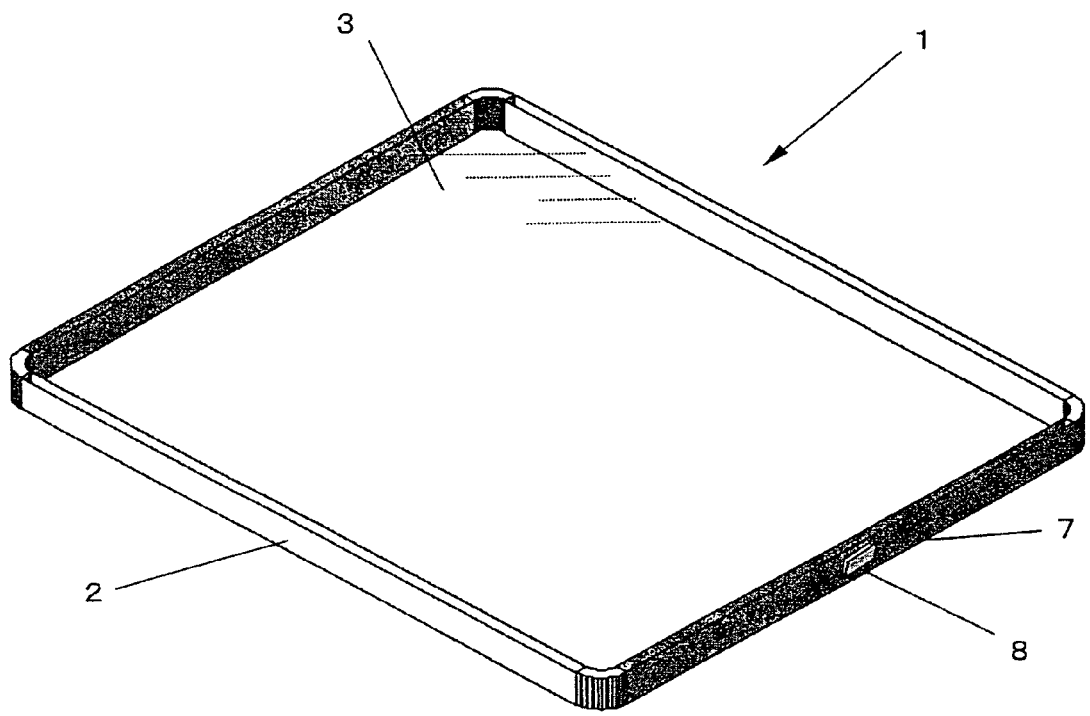
FIG. 2 is a perspective view showing an example of a pellicle.

As shown in FIG. 1(a), a pellicle 1 of the present invention comprises, at least, a pellicle frame 2, a pellicle film 3 and a sticking layer 4. In the pellicle 1 of the present invention, the pellicle film 3 is adhered to an upper end face of the pellicle frame 2 via, for example, a silicon thin film 6. Moreover, a sticking layer 4 can be usually formed on a lower end face and a liner 5 for protection of the sticking layer can be adhered to the lower end face of the sticking layer 4 in a manner that it can be peeled off.

In this case, the size of members of the pellicle is the same as that of a conventional pellicle. As materials thereof except for the pellicle film, the publicly known ones can be used.

Explaining this in more detail, as for a type of the pellicle film, it is required to have high transmittance as much as possible and high light stability against light of short wavelength such as far-ultraviolet light in a range of 200-300 nm and especially, vacuum ultraviolet light of 200 nm or less.

Accordingly, in the present invention, as shown in FIG. 1(b), the pellicle film 3 consists of multi-layer structure of fluorine-doped silica 3a and fluorocarbon resin 3b. Thereby, the pellicle film having high transmittance and high light stability against light of short wavelength can be obtained easily and at the low cost. Moreover, if it consists of the multi-layer structure as described above, disadvantages in the case of using either fluorine-doped silica or fluorocarbon resin separately as the pellicle film can be covered, and advantages can be combined. Namely, fluorine-doped silica has high transmittance and light stability against light of short wavelength, but in the case of using only it for the pellicle film, it is required a thickness of 800 μm or more in order to keep sufficient strength. So, by means of the multi-layer structure as described above, it is possible to make it thin to a thickness of, for example, 20 μm or less. Although there was an optical problem with the pellicle film when fluorine-doped silica layer had a thickness of 800 μm or more, and it was needed to take this into consideration when designing an aligner, such problems can be solved because it can be made thin to a thickness of, for example, 20 μm or less. Since fluorocarbon resin can also be made thin to a thickness of, for example, 1 μm or less, the pellicle film can be used for a practical period even when changing in color due to exposure occurs.

As the fluorocarbon resin, for example, an amorphous fluoropolymer is preferably used, which is conventionally utilized for an excimer laser. If the amorphous fluoropolymer is used, the pellicle with high transmittance and light stability against light of short wavelength such as far-ultraviolet light in a range of 200-300 nm and especially, vacuum ultraviolet light of 200 nm or less can be surely obtained.

Examples of the amorphous fluoropolymer include Cytop (manufactured by Asahi glass corporation, trade name), Teflon AF (manufactured by DuPont, trade name), and the like. These polymers can be dissolved in a solvent to be used if necessary in manufacture of the pellicle film. For example, they can be dissolved in a fluorinated solvent or the like.

As the fluorine-doped silica, it is possible to use fluorine-doped silica that has already been developed as glass for a photomask. For example, fluorine-doped silica disclosed in Japanese Patent Laid-open (Kokai) Nos. 2000-264671, 2000-26125 and the like may be included. In the present invention, for example, fluorine-doped silica as disclosed therein can be utilized by polishing it into a thin film.

OH group content of the fluorine-doped silica is preferably 10 ppm or less. The fluorine-doped silica with OH group content of 10 ppm or less as described above has a wide range of transmission wavelength, and has extremely low absorbance against light of short wavelength such as far-ultraviolet light in a range of 200-300 nm and especially, vacuum ultraviolet light of 200 nm or less. Therefore, if it is used for the pellicle film utilized at short wavelength, the excellent pellicle having high transmittance and high light stability can be obtained.

In the fluorocarbon resin layer of the pellicle film constituted as described above, absorption coefficient of ultraviolet ray at wavelength of 157 nm is preferably 0.06/μm or less, more preferably 0.01/μm or less. In the present invention, since the pellicle film is a multi-layer film, even if absorptance index of the fluorocarbon resin against light of short wavelength increases to some degree, reduction of transmittance can be small because the fluorocarbon resin layer is thin and the fluorine-doped silica layer does not deteriorate. Therefore, the pellicle with high transmittance and high light stability enough to endure practical use against light of short wavelength can be obtained.

As the material of the pellicle frame, for example silicon crystal can be used, particularly it is preferable to use silicon single crystal. If silicon single crystal is used, the pellicle frame can have high purity and high strength, and dust particles generated from the pellicle frame can be reduced.

At least one or more vents may be provided on at least one side of the pellicle frame. If there is no need, no vent may be provided.

In the case of providing the vents, the size, the shape, the number or the position of the vents is not limited. It is desirable to select the size, the shape, the number and the position depending on the mesh size of the filters located at the vents, filtering area and an amount of airflow resulted from them. It is preferable not to provide large vents more than needs, but to provide a minimum number of vents to be required.

There is no particular limit in the size, the shape and the material of the dustproof filter used for the vent, as far as it can be provided to the vent. Examples of the material of the filter for removal of dust particles include resins (PTFE (polytetrafluoroethylene), nylon 66, etc.), metal (316L stainless steel etc.), ceramics (alumina, aluminum nitride, etc.), and the like.

One in which a chemical filter containing titanium oxide layer is placed between protection nets made of organic fiber, inorganic fiber or the like can be stacked on the outer part of the dustproof filter. Or, a titanium oxide layer can be formed on a surface of organic fiber or inorganic fiber having fine pores that can serve as a dustproof filter to be unified with the filter for removal of dust particles.

The material of the chemical filter needs not to be degraded due to oxidation by titanium oxide. Therefore, fluorinated resins such as PTFE, metal (316L stainless steel etc.), or ceramics (alumina, aluminum nitride, etc.) are preferable.

As to the filter part containing titanium oxide, it is possible to utilize resin such as PTFE in which titanium oxide is mixed, inorganic (ceramics etc.) fiber on which a titanium oxide coating is formed by sol-gel method, or the like. The methods for forming them are not particularly limited.

In lithography using an $F_2$ laser, the problem of generation of gas from members such as the pellicle becomes an important factor particularly. Therefore, the material of a sticking layer preferably generates less gas if possible. Examples thereof include silicone pressure sensitive adhesive, acrylic pressure sensitive adhesive, and the like. Besides this, it is possible to fix the pellicle using mechanical method or magnetic force. The other methods can be utilized, and they are not particularly limited.

The material of a liner for protecting the sticking layer is not limited. Examples thereof include PET, PTFE, PFA, PE, PC (polycarbonate), vinyl chloride, PP, and so forth.

Figure 3:
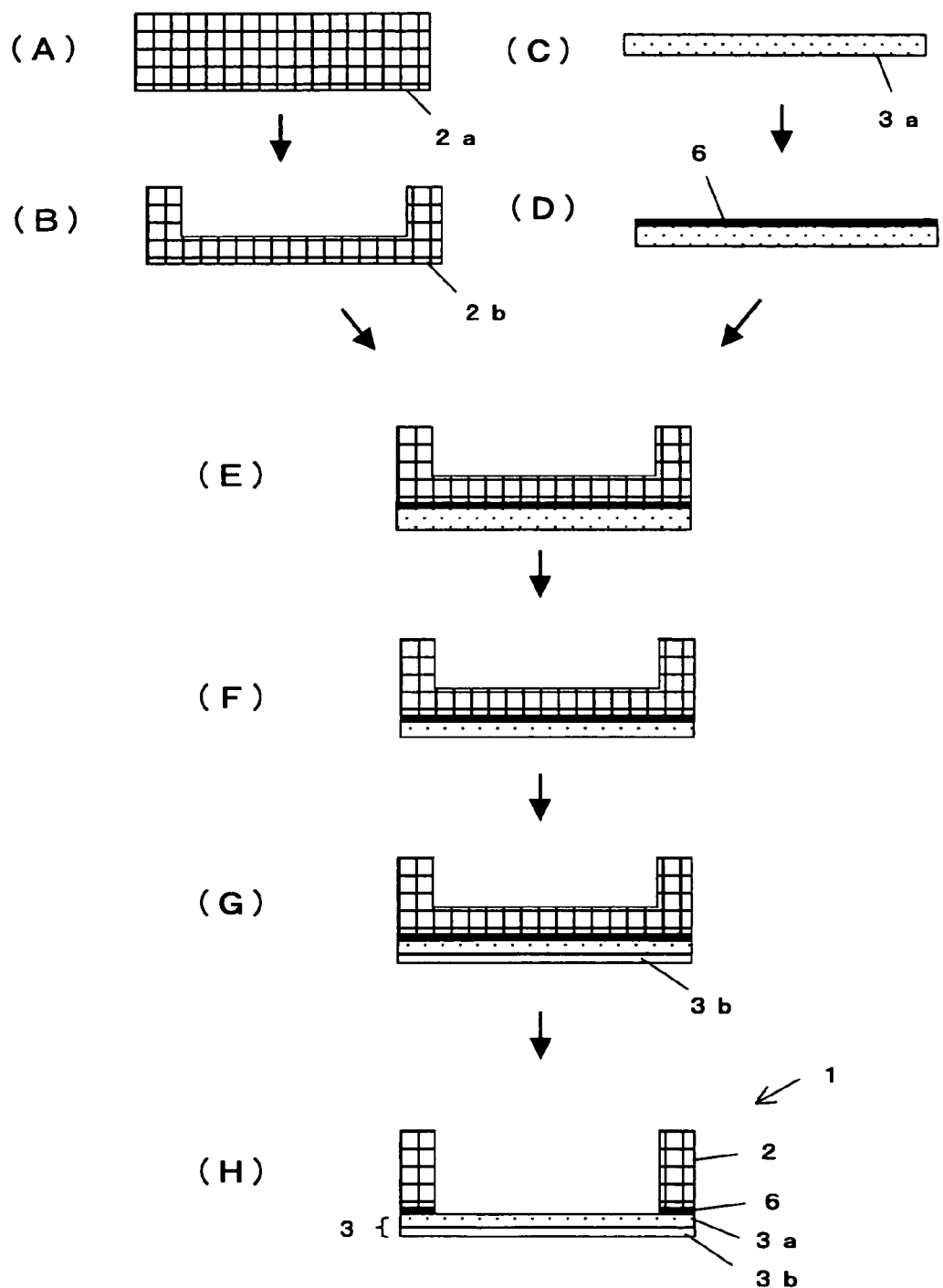
FIG. 3 is a flowchart illustrating a directly bonding method.

The pellicle of the present invention can be manufactured by directly bonding fluorine-doped silica on a surface of which a silicon thin film is formed and a pellicle frame made of silicon single crystal together via the silicon thin film, and thereafter forming a layer of fluorocarbon resin layer on a layer of the fluorine-doped silica layer. As an example of a method for bonding fluorine-doped silica and the pellicle frame made of silicon single crystal, directly bonding method will be explained in detail hereinafter with reference to FIG. 3.

In the process (A), silicon single crystal 2a used as a pellicle frame is cut into predetermined size and shape. In the subsequent process (B), the surface opposite to the side to which a pellicle film is adhered is ground (counter-bored) to be thin to a certain degree except for the part used as the pellicle frame. A thickness of the remaining part after ground is not particularly limited, but it is desirable that a subsequent process by wet etching can be performed within a practical period. The range of the thickness is preferably between 0.3 mm and 1.0 mm. The surface of the silicon single crystal plate 2b processed as above to which the pellicle film is adhered (the lower surface in FIG. 3(B)) is mirror-polished.

In the process (C), fluorine-doped silica 3a is sliced into a required size, and processed into an appropriate thickness. The thickness is not also limited, but it desirably has a thickness enough not to break during the following process. The fluorine-doped silica 3a is polished into a thin film in the following process, and therefore it is better not to be too thick since the process can not be performed within a practical period in the case that the thickness is too thick. Preferably it is processed into a thickness about 1 mm.

Subsequently, the surface of the fluorine-doped silica 3a is mirror-polished. It is desirable to mirror-polish at least one side. After mirror-polishing, this fluorine-doped silica 3a is subjected to precision cleaning, and dried in a clean oven. After drying, in the process (D), a silicon thin film 6 is formed on one side of the fluorine-doped silica 3a. A method for forming the silicon thin film 6 is not limited, and methods for forming a thin film such as a sputtering method, a thermal CVD method, and a plasma CVD method can be used.

The fluorine-doped silica 3a on which the silicon thin film 6 is formed is cleaned in a mixture of $NH_4OH$, $H_2O_2$, $H_2O$, and the like, to activate the silicon surface, and dried in clean nitrogen gas after cleaned with pure water. At the same time, the silicon single crystal plate 2b for the pellicle frame is treated with a mixture of $NH_4OH$, $H_2O_2$, $H_2O$, and the like to be activated, and dried in clean nitrogen gas after cleaned in pure water.

In the process (E), the fluorine-doped silica 3a on which the silicon thin film 6 is formed and the silicon single crystal plate 2b prepared as above are superposed via the silicon thin layer 6 with heating up to about 50° C. using an infrared heater. Through the process, fluorine-doped silica 3a is directly bonded with the silicon single crystal plate 2b via the silicon thin film 6.

In the process (F), as to one in which the fluorine-doped silica 3a and the silicon single crystal plate 2b are directly bonded together via the silicon thin film 6, only the fluorine-doped silica 3a is polished using a single side polishing apparatus so that the fluorine-doped silica 3a with a thickness of, for example, 10 µm remains. After polishing, this is subjected to precision cleaning to remove contaminants.

In the process (G), a solution of fluorocarbon resin is applied to the fluorine-doped silica 3a. After application, it is dried to form a fluorocarbon resin layer 3b.

In the process (H), one side of the silicon single crystal plate 2b opposite to the side to which the pellicle film 3 consisting of multi-layer structure of the fluorine-doped silica 3a and the fluorocarbon resin 3b is bonded, namely, the ground (counter-bored) side, is dissolved to be removed so that the part to be the pellicle frame and the like is left. Examples of a solution for wet etching include NaOH, KOH, and the like.

Silicon is dissolved to be removed by means of wet etching so that the part finally to be the pellicle frame 2 made of silicon single crystal is left. Consequently, the pellicle 1 in which the pellicle film 3 consisting of multi-layer structure of the fluorine-doped silica 3a and the fluorocarbon resin 3b is adhered to the pellicle frame 2 via the silicon thin film 6 can be obtained.

Taking workability in wet etching into consideration, it is preferable that in-plane orientation of the silicon single crystal constituting the pellicle frame is (100).

EXAMPLE

Hereinafter, the present invention will be explained specifically in reference to the example below.

Example

For a pellicle frame, silicon single crystal with in-plane orientation (100) was processed into a plate with 149 mm×122 mm×6.0 mm in an outer dimension (FIG. 3(A)). Then, one side of the plate for a pellicle frame was counter-bored to a depth of 5.0 mm so that periphery part with 5 mm in width was left. After counter-boring, another side which was not subjected to the counter-boring was polished to be a mirror surface (FIG. 3(B)).

Fluorine-doped silica for a pellicle film was processed into a plate with 149 mm×122 mm×1.0 mm in an outer dimension (FIG. 3(C)). Both sides of the fluorine-doped silica were polished to be mirror surfaces. The mirror-polished fluorine-doped silica was subjected to precision cleaning, and dried in a clean oven. After drying, one surface of the dried fluorine-doped silica was subjected to sputtering to form a silicon thin film with 0.5 µm, using an RF magnetron sputtering system and high purity silicon as a target, in an Ar atmosphere, at $3 \times 10^{-5}$ Torr in air pressure, and at 300° C. of substrate temperature. After the fluorine-doped silica on which the silicon thin film was formed was subjected to precision cleaning, it was cleaned in a mixture of $NH_4OH/H_2O_2/H_2O=1:1:5$ to activate a surface of the silicon thin film, and dried by nitrogen gas blow (FIG. 3(D)).

At the same time, the silicon single crystal plate for a pellicle frame prepared above was also cleaned in a mixture of $NH_4OH/H_2O_2/H_2O=1:1:5$ to activate its surface, and dried by nitrogen gas blow.

The silicon single crystal plate for the pellicle frame and the fluorine-doped silica prepared as described above were bonded together so that the polished surface of the silicon single crystal plate and the surface of the fluorine-doped silica on which the silicon thin film was formed might be faced. They were bonded by heating them from the side of the silicon single crystal plate using an infrared lamp to make the temperature of the silicon single crystal plate 50° C., and pressing the surface of the fluorine-doped silica with observation from the side of the fluorine-doped silica using an infrared camera so that voids might not remain in a bonding interface. The fluorine-doped silica and the silicon single crystal plate were directly bonded together via the silicon thin film through this bonding process (FIG. 3(E)). Then, heat treatment for increase of bonding strength was performed.

As to the bonded plate, the surface of the fluorine-doped silica opposite to the bonding surface with the silicon single crystal plate was polished into a thickness of 10 µm using a single side polishing apparatus, and was subjected to precision cleaning to remove contaminants (FIG. 3(F)).

For fluorocarbon resin, Teflon AF1600 (manufactured by U.S. DuPont, trade name) was dissolved into a fluorinated solvent of Fluorinert FC-75 (manufactured by U.S. 3M, trade name) to prepare a solution with concentration of 8%.

Using this solution, a transparent fluorocarbon resin film with a thickness of 0.8 µm was formed on the polished surface of the fluorine-doped silica by means of a spin coater (FIG. 3(G)).

A jig for wet etching having structure that reveals only the counter-bored part of the silicon single crystal plate and masks the other part was prepared. It was vertically dipped into an aqueous solution of 20% NaOH at 95° C. of solution temperature, and wet etching was performed for 24 hours while controlling the temperature to be constant. A rectangle window along in-plane orientation of the crystal was formed at the counter-bored part through the process, and one in which the pellicle frame made of silicon single crystal to which the multi-layer film consisting of the fluorine-doped silica and the fluorine polymer was adhered could be obtained (FIG. 3(H)). The etched surface was subjected to precision cleaning. Then, a silicone pressure sensitive adhesive was applied to the end face of the frame made of silicon single crystal to which the pellicle film was not adhered, and it was cured. After curing, a liner was adhered to the surface of the pressure sensitive adhesive to complete a pellicle.

An $F_2$ laser beam (157 nm, 0.06 mJ/cm²·pulse, 100 HZ) was irradiated to the film surface of the completed pellicle. The reduction of transmittance at 1000 J/cm² of exposure dose was 1% or less, and its transmittance was high, as well as light stability thereof was excellent.

The present invention is not limited to the embodiments described above. The above-described embodiments are mere examples and those having substantially the same structure as technical ideas described in the appended claims and providing the similar functions and advantages are included in the scope of the present invention.

What is claimed is:

1. A pellicle for lithography comprising a pellicle film, a pellicle frame to which the pellicle film is adhered, and a sticking layer placed on another end face of the pellicle frame, wherein the pellicle film consists of multi-layer structure of fluorine-doped silica and fluorocarbon resin thereby supplementing the strength of the pellicle film; wherein an absorption coefficient of an ultraviolet ray at a wavelength of 157 nm of a layer of the fluorocarbon resin of the pellicle film is 0.06/μm or less; and wherein a thickness of a layer of the fluorine-doped silica is 20 μm or less, and a thickness of the layer of the fluorocarbon resin is 0.8 μm or more and 1 μm or less.

2. The pellicle for lithography according to claim 1, wherein the fluorocarbon resin is an amorphous fluoropolymer.

3. The pellicle for lithography according to claim 1, wherein OH group content of the fluorine-doped silica is 10 ppm or less.

4. The pellicle for lithography according to claim 2, wherein OH group content of the fluorine-doped silica is 10 ppm or less.

5. The pellicle for lithography according to claim 1, wherein the pellicle frame is made of silicon single crystal.

6. The pellicle for lithography according to claim 2, wherein the pellicle frame is made of silicon single crystal.

7. The pellicle for lithography according to claim 5, wherein the pellicle film and the pellicle frame are bonded together via a silicon thin film.

8. The pellicle for lithography according to claim 6, wherein the pellicle film and the pellicle frame are bonded together via a silicon thin film.

9. The pellicle for lithography according to claim 5, wherein in-plane orientation of the silicon single crystal constituting the pellicle frame is (100).

10. The pellicle for lithography according to claim 6, wherein in-plane orientation of the silicon single crystal constituting the pellicle frame is (100).

11. The pellicle for lithography according to claim 7, wherein in-plane orientation of the silicon single crystal constituting the pellicle frame is (100).

12. The pellicle for lithography according to claim 8, wherein in-plane orientation of the silicon single crystal constituting the pellicle frame is (100).

* * * * *